United States Patent [19]

Söderbärg et al.

[11] Patent Number: 5,886,384
[45] Date of Patent: Mar. 23, 1999

[54] SEMICONDUCTOR COMPONENT WITH LINEAR CURRENT TO VOLTAGE CHARACTERISTICS

[75] Inventors: Anders Söderbärg, Upsala; Andrej Litwin, Danderyd, both of Sweden

[73] Assignee: Telefonakitebolaget LM Ericsson, Stockholm, Sweden

[21] Appl. No.: 900,110

[22] Filed: Jul. 25, 1997

[30] Foreign Application Priority Data

Jul. 26, 1996 [SE] Sweden .................................. 9602880

[51] Int. Cl.⁶ ............................................. H01L 27/12
[52] U.S. Cl. ........................................ 257/347; 257/343
[58] Field of Search ................................. 257/347–354, 257/335, 343

[56] References Cited

U.S. PATENT DOCUMENTS

| 5,068,700 | 11/1991 | Yamaguchi et al. | 257/343 |
|---|---|---|---|
| 5,237,186 | 8/1993 | Nakagawa et al. | 257/343 |
| 5,246,870 | 9/1993 | Merchant | 257/347 |
| 5,286,995 | 2/1994 | Malhi | 257/343 |
| 5,300,448 | 4/1994 | Merchant et al. | 437/41 |
| 5,304,827 | 4/1994 | Malhi et al. | 257/343 |
| 5,356,822 | 10/1994 | Lin et al. | |
| 5,362,979 | 11/1994 | Merchant | 257/347 |
| 5,378,912 | 1/1995 | Pein | 257/335 |
| 5,382,535 | 1/1995 | Malhi et al. | 437/40 |
| 5,412,241 | 5/1995 | Merchant | 257/347 |
| 5,548,150 | 8/1996 | Omura et al. | 257/349 |
| 5,648,671 | 7/1997 | Merchant | 257/347 |
| 5,710,451 | 1/1998 | Merchant | 257/347 |

FOREIGN PATENT DOCUMENTS

| 0 205 635 | 12/1986 | European Pat. Off. . |
|---|---|---|
| 0 331 063 | 9/1989 | European Pat. Off. . |
| 258 498 | 7/1988 | German Dem. Rep. . |
| WO91/07781 | 5/1991 | WIPO . |

Primary Examiner—David B. Hardy
Attorney, Agent, or Firm—Burns, Doane, Swecker & Mathis, L.L.P.

[57] ABSTRACT

A semiconductor device has a linear current-to-voltage characteristic through the origin of coordinates and additionally a bi-directional structure. The typical device contains an oxide layer on top of a p⁻ doped substrate. On top of this oxide layer a n-type drift region is created which forms a longitudinal n-drift region. The n-drift region comprises at each end a low doped p-type well which has a portion with strongly doped p⁺ semiconductor material which will constitute contacting to either a source or a drain electrode. Each p-type well additionally contains a n⁺ area and additionally on top of said p-type well a gate electrode, whereby the n⁺ doped area is positioned in the p-well between a gate and a drain electrode or a gate and a source electrode, respectively. Thus a bi-directional double DMOS structure is created having a common drift region.

7 Claims, 3 Drawing Sheets

SEMICONDUCTOR COMPONENT WITH LINEAR CURRENT TO VOLTAGE CHARACTERISTICS

TECHNICAL FIELD

The present invention refers to an improvement of a Lateral Insulated Gate Bipolar Transistor (LIGBT) on SOI (Silicon-On-Insulator) wafers to obtain a linear current-to-voltage characteristics through the origin of coordinates.

BACKGROUND

The cross section of a Lateral Insulated-Gate Bipolar Transistor on SOI (Silicon-On-Insulator) wafer is illustrated in FIG. 1. FIG. 2 shows a simple equivalent circuit of this complex device, which may be described by two equivalent field effect transistors and two junction transistors T1 and T2, wherein the p-well further acts as a source resistor for T2. The LIGBT device looks similar to the Lateral Double-diffused Metal-Oxide-Semiconductor (LDMOS) transistor. The LDMOS transistor is very similar to the familiar NMOS transistor except that the drain contact is separated from the channel region by several microns of lightly-doped material known as the drift region. A schematic LDMOS device is demonstrated in FIG. 3, being similar to the device of FIG. 1 except that the $p^+$ region referred to as an anode is replaced by a $n^+$ diffusion, which then is referred to as a drain. In the off-state the LDMOS can use this drift region to support a high drain voltage at the two reverse-biased pn junctions that it forms with the p-well and p-type substrate. This simple modification has a profound effect on the operating characteristics of this device regarding the current-to-voltage characteristics.

In the on-state the LIGBT illustrated in FIG. 1 has an on-resistance which is 5–10 times lower than that of an equivalent LDMOS according to FIG. 3, which makes it a better choice for applications where resistance is of importance. However, the LIGBT has a drawback of having a very high resistance at low currents due to the pn diode at the anode side, which will cause distortion if the transistor is operated at low currents as it will present a non-linear function in this region.

It is possible to design a hybrid IGBT and DMOS device with both $n^+$ and $p^+$ diffusions at the anode contact region as illustrated in FIG. 4. This configuration is normally denoted as a Short-Anode LIGBT (SA-LIGBT). With a positive voltage greater than the threshold voltage applied to the gate and a low voltage on the anode this device conducts electron current like an LDMOS device. At a certain current level a voltage drop developed along the $p^+$ region is sufficient to forward-bias the anode/drift junction and the anode begins injecting minority carriers (holes) into the drift region. These minority carriers modulate the conductivity of the drift region and the device operators like a normal LIGBT. Thus, such a device will have DMOS linear behavior at[31] low currents until the series resistance in the n-drift region will forward-bias the anode p and n junction at higher currents and the device assumes the IGBT current-to-voltage characteristics. Thus the total current-to-voltage characteristics curve may present two fairly linear portions but having quite different derivatives (slopes). Accordingly there will be a transition in the characteristics between the two slopes of the curve where non-linearity will be present and which of course still will produce distortion. (Further information on this may for instance be found in the Technical Report No. ICL 93-020 by Donald R. Disney having the title "Physics and Technology of Lateral Power Devices in Silicon-On-Insulator Substrates", Department of Electrical Engineering, Stanford University, Calif. USA, 1993.)

Besides, if the substrate biasing underneath the insulator in the SOI material is varying, the series resistance in the n-drift region will vary substantially due to the accumulation or depletion of the electrical charge carriers at the insulator and silicon interface, and consequently the current-to-voltage characteristics of the device will vary. Also the transistor will not support the operation under AC conditions since the highest voltage is assumed to be at the $p^+$ anode.

In some applications such as relay functions in telephone systems there are requirements both of linearity through the origin of coordinates and bi-directional voltage support.

For example U.S. Pat. No. 5,382,535 of 1995, by Malhi and Ng, discloses a "Method of fabricating performance Lateral Double-diffused MOS Transistor", which demonstrates a kind of symmetry and utilizes a technique commonly referred to as RESURF, which stands for REduced SURface Field. However this solution has a centrally extending drain between two source contacts, i.e. the source of one side is not utilized as a drain and vice versa. This means that it can not be considered to be a bilateral solution, but such a component must be connected in series with a corresponding LDMOS to obtain bilateral action.

SUMMARY

The present invention does improve the mentioned drawbacks of the LIGBT, thereby making it linear through the origin of coordinates regarding the current-to-voltage characteristics, but also representing a bi-directional structure this will as well allow an AC operation.

The present invention- provides a DMOS transistor structure instead of the anode of an IGBT on a SOI wafer. In its most elementary form the anode will be symmetric to the cathode.

In the on-state both gates are biased in such a way that the DMOS transistors are in an on-state. At the anode side the current will first go through a second transistor until the voltage drop in the transistor will forward-bias the p-well diode and start to conductivity modulate the drift region, giving a LIGBT current-to-voltage (I-V) characteristics. The symmetry of the inherent transistors makes the device possible to be operated under AC conditions.

The improved design may include $p^{30}$ electrodes included in the lateral design of the transistor to improve the conductivity modulation of the drift region. Also a non-uniform drift region doping can be designed to optimize the voltage breakdown versus on-resistance.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
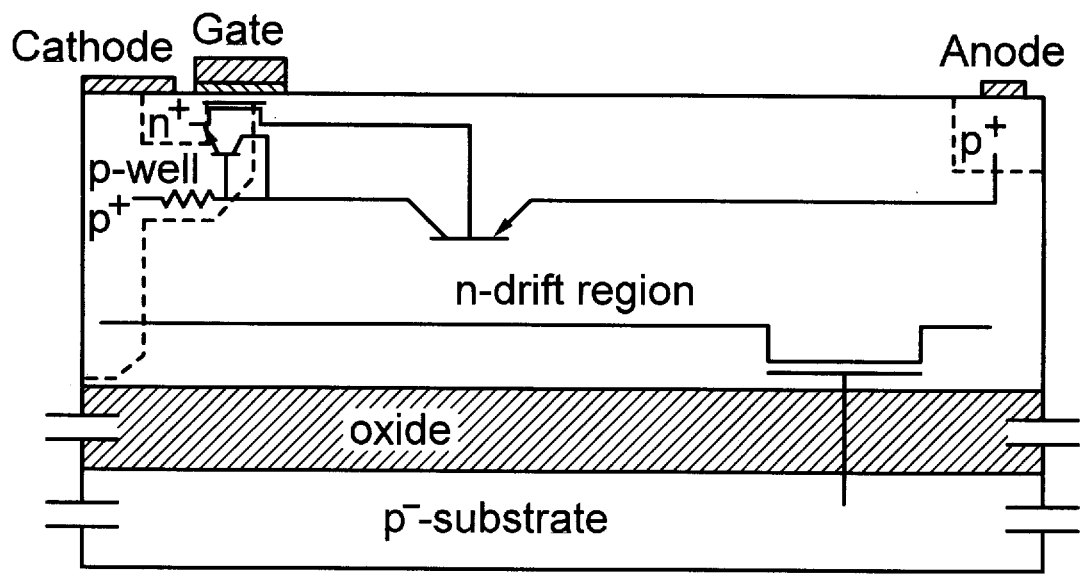
FIG. 1 demonstrates a cross section of a LIGBT device.
Figure 2:
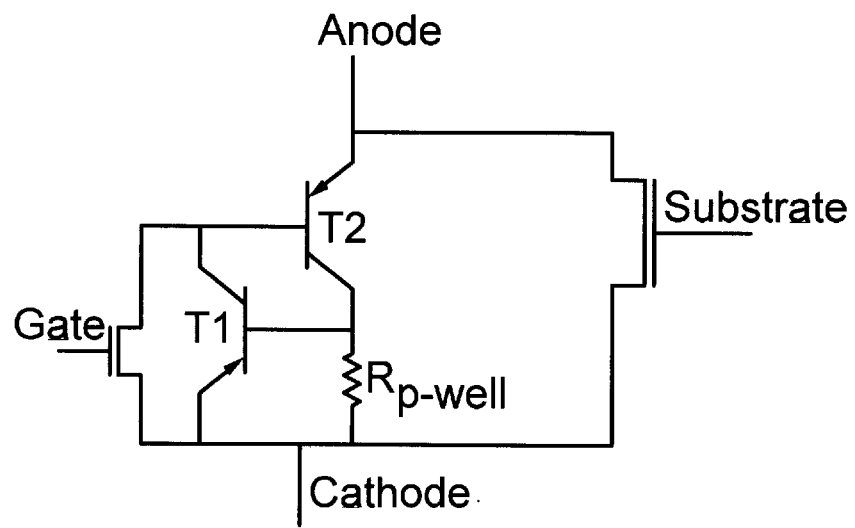
FIG. 2 shows an equivalent circuit diagram of a LIGBT device.
Figure 3:
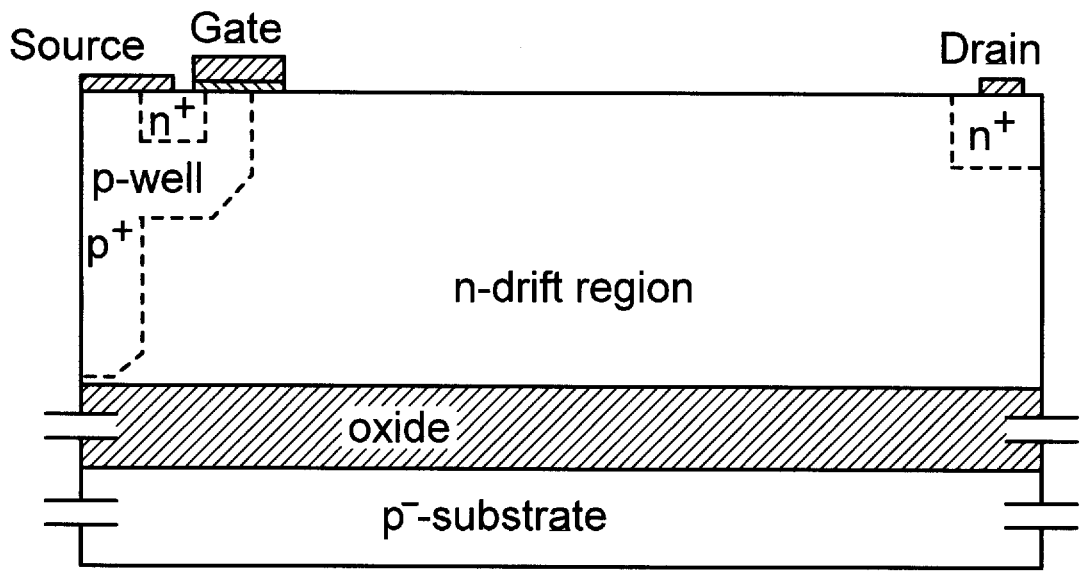
FIG. 3 shows a cross section of a LDMOS transistor.
Figure 4:
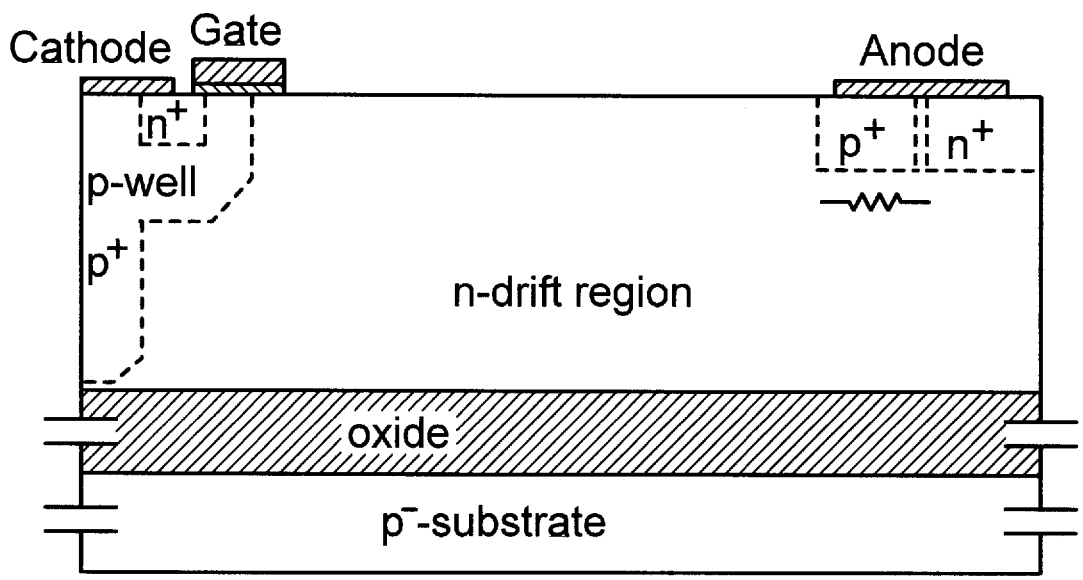
FIG. 4 shows a cross section of a shorted-anode LIGBT device.
Figure 5:
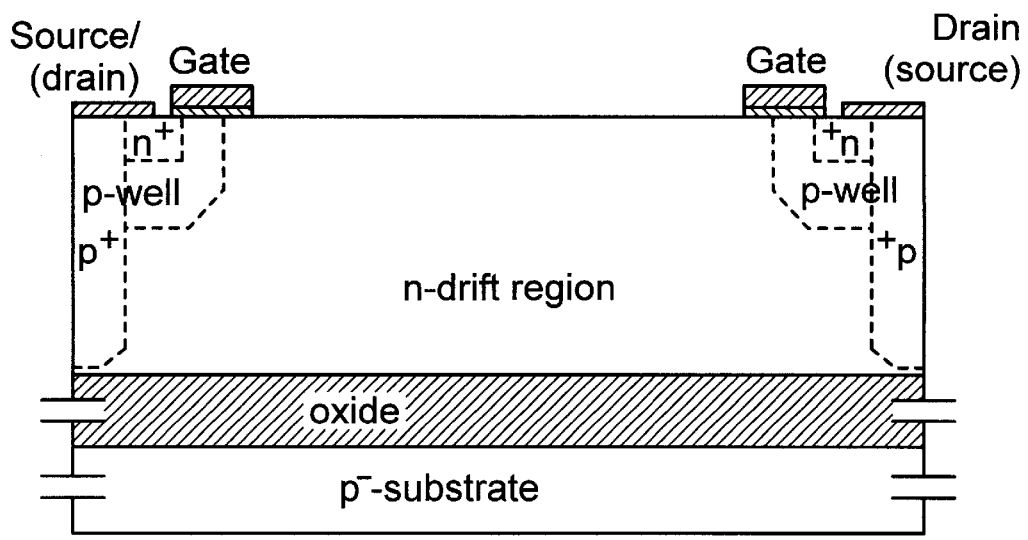
FIG. 5 shows a cross section of a bi-directional IGBT device according to the present invention.
Figure 6:
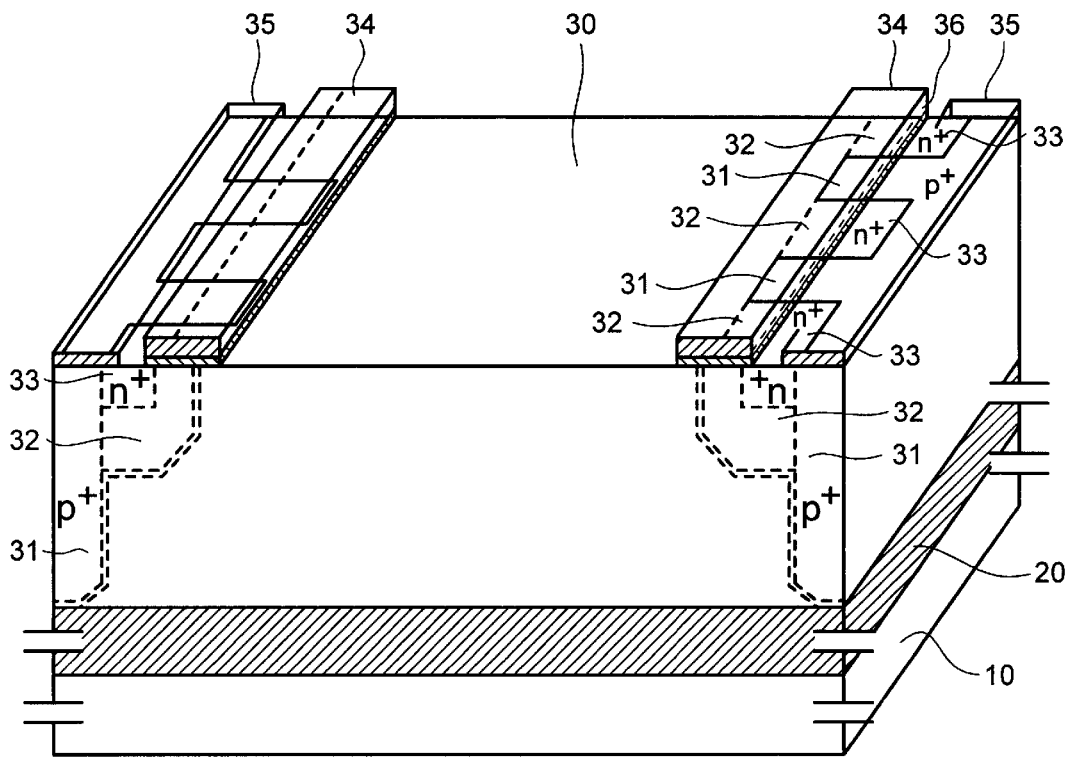
FIG. 6 shows a cross section of a sectioned bi-directional IGBT device according to the invention.

In FIGS. 5 and 6 is demonstrated a structure according to the present invention which provides a DMOS transistor instead of the anode of the IGBT on SOI wafer. In its most elementary embodiment the anode will be fully symmetric to the cathode as is clearly demonstrated in FIG. 5.

The semiconductor device of FIG. 5 for obtaining a linear current-to-voltage characteristics through the origin of coordinates combined with a bi-directional structure contains in the illustrative embodiment an oxide layer on top of a p⁻ doped substrate. On top of this oxide layer a n-type drift region is created which forms a longitudinal n-drift region. The n-drift region comprises at each end a p-type well of $p^{30}$ doped semiconductor material and each p-type well additionally contains a n⁺ area which will constitute either a source or a drain electrode. Additionally on top of the p-type wells there are created gate electrodes to obtain a field effect structure for controlling the current in the channel region. Thus a bi-directional double DMOS structure is created having a common drift region.

As a starting material may be utilized a SOI material consisting of a substrate 10, an insulator layer 20 and a semiconductor top layer 30. The substrate 10 may be a weakly or strongly doped silicon substrate having a thickness of 10 to 1000 $\mu$m. The substrate may also be an insulator consisting of silicon dioxide, sapphire, diamond or the like. The insulator 20 in the illustrative embodiment may be silicon dioxide layer having a thickness of 0.1 to 10 $\mu$m. Alternatively the insulator may just be the same type of material as the substrate 10 itself, i.e., silicon dioxide, sapphire, diamond or the like. The top layer 30 may, preferably, be a weakly doped silicon layer having a thickness of 0.1–30 $\mu$m.

An illustrative component may be manufactured by first growing or depositing a thin protective oxide over the top layer 30. Subsequently an implantation of a n⁻ doping substance takes place such that the correct basic doping level is achieved in the top layer. The implanted dose may be of the order $10^{11}$ to $10^{13}$ cm$^{-2}$. After a subsequent annealing the $p^{30}$ regions 31 may be created by performing an implantation through a photolithographically defined pattern. A suitable dose level will be $10^{14}$ to $10^{16}$ cm$^{-2}$. The p⁺ regions are among other things necessary for obtaining a good contacting to p-well areas 32, which in this example are defined in a later step. After the material, which defined the litography pattern, has been removed a subsequent annealing will drive the p⁺ region 31 down to the buried insulator as is indicated in FIG. 5. However this is not entirely necessary and may be difficult to put into practice in a case when the top layer 30 is thick.

After that the basic doping levels of the top layer as well as the p⁺ regions 31 have been defined the protective oxide can be removed. A gate oxide and a gate material may then be grown or deposited, respectively, over the top layer 30. The thickness of the gate oxide in the illustrative embodiment could be of the order 50–1000 Å. The gate material could consist of strongly doped polycrystaline silicon having a thickness of 0.1–1 $\mu$m. By means of a subsequent lithographical pattern the gate structure both for the drain and source side may be defined by etching. A suitable length of the gate could be 0.2–5 $\mu$m.

By means of an additional lithographical pattern the p-well 32 will be added by implantation of a dose of an order $10^{11}$–$10^{14}$ cm$^{-2}$. The pattern is defined in such a manner that the p-well area 32 is ruled toward one edge 36 of the gate structure. (Such an edge is indicated by a dotted line 36 in FIG. 6). In a subsequent annealing the channel length will be determined (how far the p-well reaches under the gate structure) by a lateral diffusion. In the same manner the n⁺ regions 33 at the drain and source side, respectively, will be defined and heat treated. Notice that a p-well 32 limited by a dashed line then contains a highly doped p⁺ region 31 and at least one n⁺ region as indicated in FIGS. 5 and 6.

The length of the drift region (the distance between source and drain) is determined by the voltage level to be accepted and tolerated by the component. To further improve the voltage acceptance ability for a given length of the drift region a laterally varying doping profile, may be used to obtain an electric field distribution as even as possible from source to drain. A laterally varying doping profile may be defined in the same manner as for all other doped areas.

In a further embodiment the drift region is not uniformly doped but the concentration increases from the source toward the center of the device and then decreases again toward the drain. Such a non-uniform drift region for a more simple fabrication will be stepwise doped and stepwise increasing toward the center when seen laterally from the source or drain, respectively.

Subsequent steps to completely define the component will be standardized steps for contact holes, metallization and passivation.

An additional advantage of the disclosed component besides the ability of presenting a current-to-voltage characteristic which will be linear through the origin of coordinates, the device can also due to its bi-directional structure be controlled to operate as either a DMOS device having source and drain or a IBGT device with cathode and anode by utilizing a first gate for controlling the drift region and a second gate to by means of a biasing voltage define the mode of operation.

It will be understood by those skilled in the art that various modifications and changes may be made to the device according to the concept of the present invention without departure from the spirit and scope thereof, which is defined by the appended claims.

What is claimed:

1. A semiconductor device for obtaining a linear current-to-voltage characteristic, comprising an insulating layer on top of a substrate and on top of said insulating layer a n-type drift region; said n-type drift region at each end forming a low doped p-type region constituting a p-type well which in turn has a highly doped n⁺ region forming a source area at one end and a drain area at the other end; said p-type well further containing at least one portion of p⁺ doped semiconductor material and additionally on top of said p-type well a gate electrode, said n⁺ region being placed in said p-type well between the gate electrode and a drain electrode at one end and between the gate electrode and a source electrode at the other end; thereby forming a bi-directional double DMOS structure having a common n-type drift region.

2. The semiconductor device according to claim 1, wherein said substrate is a n-doped or p-doped silicon substrate.

3. The semiconductor device according to claim 1, wherein said substrate is an insulator.

4. The semiconductor device according to claim 1, wherein said substrate is an oxide insulator.

5. The semiconductor device according to claim 1, wherein said p⁺ doped semiconductor material at some areas in the p-type well at a source and drain side, respectively, reaches substantially all the way to said drift region to improve the injection of minority carriers.

6. The semiconductor device according to claim 1, wherein said n-type drift region is not uniformly doped but the doping concentration increases toward the center of the drift region seen from the source or drain, respectively, and decreases toward the drain or source, respectively when seen from the center of the drift region.

7. The semiconductor device according to claim 6, wherein said drift region doping is increasing in a stepwise manner toward the center of the drift region seen from the source or drain, respectively.

* * * * *